(12) United States Patent
Lee

(10) Patent No.: US 7,486,016 B2
(45) Date of Patent: Feb. 3, 2009

(54) ORGANIC ELECTROLUMINESCENT DISPLAY DEVICE

(75) Inventor: Kwan-Hee Lee, Seoul (KR)

(73) Assignee: Samsung SDI Co., Ltd., Suwon-si (KR)

( * ) Notice: Subject to any disclaimer, the term of this patent is extended or adjusted under 35 U.S.C. 154(b) by 307 days.

(21) Appl. No.: 10/820,845

(22) Filed: Apr. 9, 2004

(65) Prior Publication Data

US 2004/0239238 A1 Dec. 2, 2004

(30) Foreign Application Priority Data

May 30, 2003 (KR) .................. 10-2003-0034947

(51) Int. Cl.
*H05B 33/14* (2006.01)
*H01L 51/50* (2006.01)
(52) U.S. Cl. .................. 313/506; 313/504; 313/503
(58) Field of Classification Search ......... 313/503–506, 313/512, 498; 428/690
See application file for complete search history.

(56) References Cited

U.S. PATENT DOCUMENTS 6,758,538 B2 * 7/2004 Fujita et al. ............. 313/506
6,831,407 B2 * 12/2004 Cok ....................... 313/504
7,038,373 B2 * 5/2006 Arnold et al. ............ 313/506
2002/0043928 A1 4/2002 Cho

OTHER PUBLICATIONS

Office Action issued on Aug. 3, 2007 by the Chinese Intellectual Property Office for Chinese Patent Application No. 200410045940.9.

* cited by examiner

*Primary Examiner*—Nimeshkumar D Patel
*Assistant Examiner*—Anne M Hines
(74) *Attorney, Agent, or Firm*—Stein, McEwen & Bui, LLP

(57) ABSTRACT

An organic electroluminescent display device includes an anode electrode formed on a substrate; a buffer pattern formed under the anode electrode having a certain thickness; a pixel define layer for exposing a portion of the anode electrode; an organic thin film layer formed on the anode electrode; and a cathode electrode formed on the substrate. An upper surface of the pixel define layer is at least coplanar with or lower than that of the anode electrode. The thickness of the pixel define layer is at least substantially the same as or less than a sum of thicknesses of the anode electrode and the buffer pattern.

14 Claims, 4 Drawing Sheets

ORGANIC ELECTROLUMINESCENT DISPLAY DEVICE

CROSS-REFERENCE TO RELATED APPLICATION

This application claims the benefit of Korean Patent Application No. 2003-34947, filed on May 30, 2003 in the Korean Intellectual Property Office, the disclosure of which is hereby incorporated herein by reference in its entirety.

BACKGROUND OF THE INVENTION

1. Field of the Invention

The present invention relates to a flat panel display, more particularly, to an organic electroluminescent display device capable of improving luminance non-uniformity and extending life time by removing a height difference between an anode electrode and a pixel define layer so that a good organic thin film layer is formed, and a fabrication method of the organic electroluminescent display device.

2. Description of the Related Art

FIG. 1 illustrates a cross sectional view of a conventional organic electroluminescent display device. Referring to FIG. 1, anode electrodes 21 are formed on a substrate 20 spaced apart from each other in a certain distance per each pixel, such as R, G and B unit pixels. A pixel define layer 23 is formed on the substrate 20 so that a portion of the anode electrode 21 is exposed to form an opening 22. The pixel define layer 23 has an organic insulation film, which defines neighboring anode electrodes 21 per each pixel. An R, G or B emitting layer 25 is formed on the opening 22 of the anode electrode 21. A cathode electrode 27 is formed on the substrate 20 above the layer 25. Although it is not illustrated on drawing, the emitting layer 25 has at least one layer selected from a hole injection layer, a hole transport layer, a hole barrier layer, an electron injection layer and an electron transport layer.

Important features of the organic electroluminescent display device are a flatness of a conductive material used in the anode electrode 21 and a structure of the pixel define layer 23 having the organic insulation film for determining size of the opening 22 in the anode electrode 21. Conventionally, the anode electrode 21 is formed by patterning a deposited anode electrode material after depositing an anode electrode material on the substrate 20. The pixel define layer 23 is subsequently formed by patterning a deposited organic insulation film to expose a portion of the anode electrode 21 after depositing an organic insulation film on the substrate 20. Therefore, the pixel define layer 23 is formed in such a manner that the pixel define layer 23 has a higher step difference than the anode electrode 21 as shown in FIG. 1.

As described above, the conventional organic electroluminescent display device has problems in that a polymer remains since the pixel define layer 23 is formed by patterning the organic insulation film using a photosensitive photoresist. Furthermore, the conventional organic electroluminescent display device has problems in that a luminance becomes non-uniform and the life time deteriorates since the emitting layer 25 and the cathode electrode 27 are incompletely formed during the process of successively forming the emitting layer 25 and the cathode electrode 27 due to an angle of a part of the pixel define layer 23 having a step difference from the anode electrode 21. Also, the organic thin film layer deteriorates by outgassing generated from the photoresist. Moreover, the conventional organic electroluminescent display device has had problems due to contact defects generated between the anode electrode 21 and the organic emitting layer 25 since an organic material is not properly transferred at the part of the pixel define layer 23 having the step difference from the anode electrode 21 when the organic emitting layer is formed using a laser induced thermal imaging method.

SUMMARY OF THE INVENTION

An aspect of the invention is to provide an organic electroluminescent display device capable of obtaining uniform luminance and long life time by preventing deterioration of an organic emitting layer and a fabrication method of the organic electroluminescent display device.

It is another aspect to provide an organic electroluminescent display device capable of forming a good organic emitting layer by forming a pixel define layer having a lower step difference than an anode electrode, and a fabrication method of the organic electroluminescent display device.

Additional aspects and/or advantages of the invention will be set forth in part in the description which follows and, in part, will be obvious from the description, or may be learned by practice of the invention.

According to an aspect of the present invention, an organic electroluminescent display device includes a lower electrode formed on a substrate; a pixel define layer for exposing a portion of the lower electrode; an organic thin film layer formed on the lower electrode; and an upper electrode formed on the substrate, wherein the pixel define layer has at least a same or lower step difference above the substrate as a step difference of the lower electrode above the substrate.

According to an aspect of the present invention, the organic electroluminescent display device further comprises a buffer pattern having a certain thickness formed under the lower electrode for smoothing the step difference to be at or above the step difference of the pixel define layer.

According to an aspect of the invention, the buffer pattern comprises an inorganic insulation film including an oxide film or a nitride film, or an organic insulation film including a thermosetting resin or a photosensitive resin, and a thickness of the pixel dividing layer is at least the same as or less than a sum of thicknesses of the lower electrode and the buffer pattern.

According to an aspect of the present invention, the lower electrode comprises a reflective electrode material selected from the group consisting of Al, Al/ITO, Cr, Pt, Au, Ag, Ag/ITO, Al/IZO, Ag/IZO, Pd, Ni and an alloy film thereof, or a transmittive electrode material selected from the group consisting of ITO, IZO and ATO.

According to an aspect of the present invention, an organic electroluminescent display device includes a substrate comprising a plurality of pixel regions; a plurality of lower electrodes formed in the plurality of pixel regions, respectively; a plurality of buffer patterns formed under the plurality of lower electrodes, respectively; a pixel define layer for defining neighboring lower electrodes in the plurality of lower electrodes; organic thin film layers formed on the lower electrodes; and an upper electrode formed on the pixel define layer and the organic thin film layer, wherein the pixel define layer is formed in such a way that an upper surface of the pixel define layer is at least coplanar with or lower than that of the lower electrode by the buffer pattern.

According to an aspect of the present invention, a fabrication method of an organic electroluminescent display device includes forming a buffer pattern for smoothing a step difference on a substrate; forming a lower electrode on the buffer pattern; forming a pixel define layer on the substrate to expose a portion of the pixel electrode; forming an organic thin film layer on the lower electrode; and forming an upper electrode on the substrate, wherein an upper surface of the pixel define layer is at least coplanar with or lower than that of the lower electrode by the buffer pattern.

According to an aspect of the present invention, the buffer pattern or pixel dividing layer is formed by depositing a thermosetting resin on the substrate and dry etching the thermosetting resin using a photoresist film, or formed by depositing a photosensitive resin on the substrate and patterning the photosensitive resin through an exposure and developing process.

According to an aspect of the present invention, the organic thin film layer is formed using a laser induced thermal imaging or inkjet printing method, and the pixel define layer has a thickness determined by a combined thickness of the buffer pattern and the lower electrodes.

BRIEF DESCRIPTION OF THE DRAWINGS

The above and/or other features and advantages of the present invention will become more apparent to and more readily appreciated by those of ordinary skill in the art by describing in detail embodiments thereof with reference to the accompanying drawings in which.

DETAILED DESCRIPTION OF THE EMBODIMENTS

Figure 1:
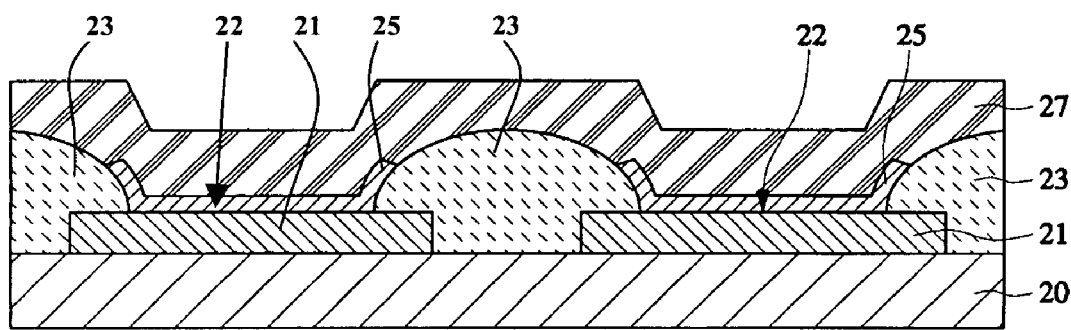
FIG. 1 is a cross section view illustrating a conventional organic electroluminescent display device.

The present invention will now be described in detail in connection with embodiments with reference to the accompanying drawings. For reference, like reference characters designate corresponding parts throughout several views.

Figure 2:
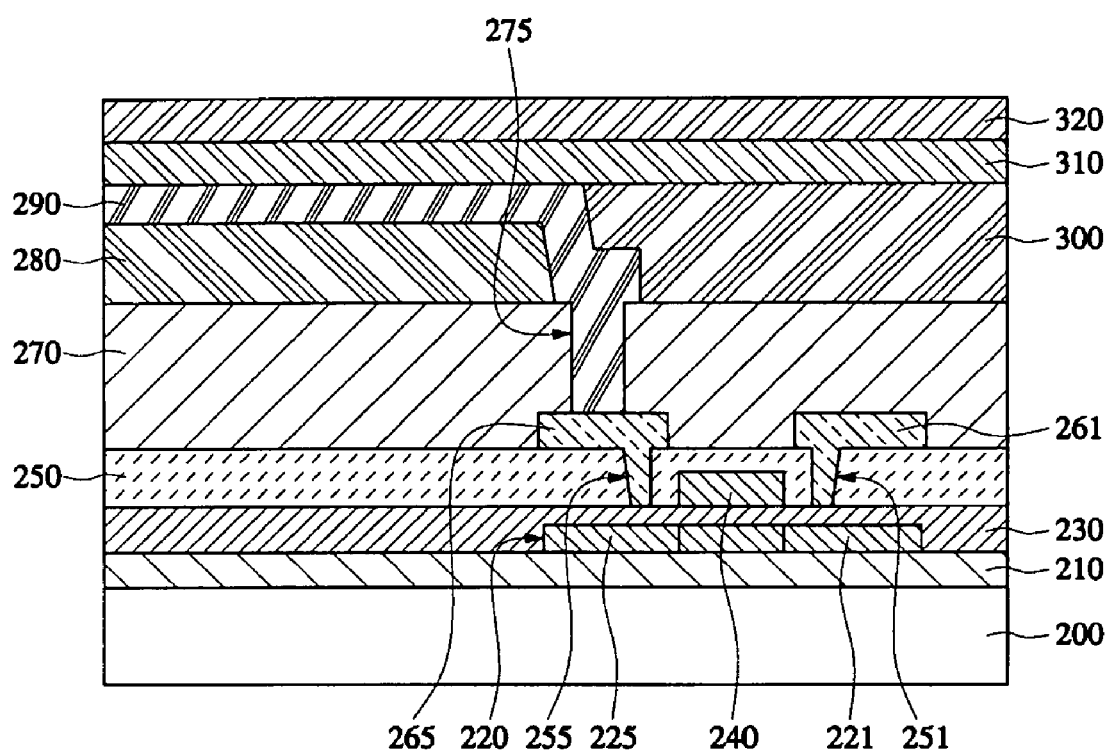
FIG. 2 is a cross section view illustrating an organic electroluminescent display device according to an embodiment of the present invention.

FIG. 2 illustrates a cross sectional view of an organic electroluminescent display device according to an embodiment of the present invention. Referring to FIG. 2, a buffer layer 210 is formed on a transparent insulation substrate 200. A semiconductor layer 220 including source/drain regions 221 and 225 is formed on the buffer layer 210. A gate 240 is formed on a gate insulation film 230. Source/drain electrodes 261 and 265 are formed on an interlayer insulation film 250 and are connected to the source/drain regions 221 and 225 through contact holes 251 and 255. A passivation film 270 is formed above the interlayer insulation film 250 and the source/drain electrodes 261 and 265.

A buffer pattern 280 is formed on the passivation film 270. The buffer pattern 280 smoothes a step difference between an anode electrode 290 above the substrate 200 and a step difference between a pixel define layer 300 and the substrate 200 such that a thickness of the electrode 290 above the substrate 200 is substantially the same as the pixel define layer 300 above the substrate 200. The anode electrode 290 is formed on the buffer pattern 280 in such a way that the anode electrode 290 is connected to one of the source/drain electrodes 281 and 285. For example, the anode electrode 290 is shown connected on the drain electrode 265 through a via hole 275. It is understood that the buffer pattern 280 need not be used in all aspects of the invention.

The pixel define layer 300 defines the anode electrode 290 for each pixel (i.e., R, G and B unit pixels). The pixel define layer 300 is formed on the passivation film 270 between adjacent anode electrodes 290. According to an aspect of the invention, the pixel define layer 300 is formed in such a way that the pixel define layer 300 has at least the same step difference as the step difference of the anode electrode 290. According to another aspect of the invention, the pixel define layer 300 has a lower step difference than the step difference of the anode electrode 290. In other words, the upper surface of the anode electrode 290 is substantially coplanar with or is lower than the upper surface of the pixel define layer 300.

An organic thin film layer 310 is formed on the anode electrode 290. A cathode electrode 320 is formed on the thin film layer 310. While not explicitly shown, the organic thin film layer 310 is formed of a R, G, or B emission layer comprising at least one layer selected from a hole injection layer, a hole transport layer, a hole barrier layer, an electron injection layer and an electron transport layer.

In the organic electroluminescent display device according to an embodiment of the present invention, the pixel define layer 300 is formed to have a lower step difference than the step difference of the anode electrode 290, or the pixel define layer 300 has a same step difference as the step difference of the anode electrode 290. Thus, a good organic thin film layer 310 can be formed accordingly due to a superior adhesive force between the organic thin film layer 310 and the anode electrode 290. Therefore, a deterioration of the device due to outgassing from a photoresist film is prevented.

Referring to FIG. 3A to FIG. 3E, a fabrication method of an organic electroluminescent display device of an embodiment of the present invention having the foregoing structure is described as follows. For the sake of simplicity and as the construction of the remaining parts are understood, FIG. 3A to FIG. 3E are limited to an EL device part in the organic electroluminescent display device. Specifically and with reference to FIG. 2, it is understood that the construction of the remaining parts includes forming a buffer layer 210 on a transparent insulation substrate 200 as illustrated in FIG. 2, forming a thin film transistor through an ordinary thin film transistor forming process, and forming a passiviation film 270 on the substrate 200 including the thin film transistor.

Figure 3A:
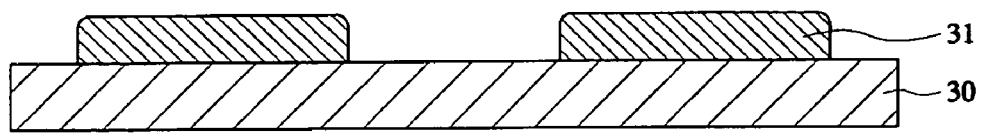
FIG. 3A to FIG. 3E are cross sectional views for illustrating a fabrication method of organic electroluminescent display device according to an embodiment of the present invention.

Referring to FIG. 3A, a buffer material for smoothing a step difference is deposited on the substrate 30 to a thickness of 0.5 to 2.0 µm. The substrate 30 includes the substrate 200, the thin film transistor, and the passivation film 270 shown in FIG. 2. According to aspects of 6the invention, the buffer material includes an organic insulation film or an inorganic insulation film. Examples of the organic insulation film include a photosensitive material (such as a polyimide based resin, a polyacryl based resin and a polyphenol based resin having superior flatness), or a thermosetting resin such as BCB. Examples of the inorganic insulation film include a nitride film or oxide film. However, it is understood that other suitable materials can be used.

The buffer material is patterned to form a buffer pattern 31. Where the buffer material is a photosensitive material, the buffer pattern 31 is formed by patterning the buffer material through an exposure and developing process. Where the buffer material is a thermosetting resin, the buffer pattern 31 is formed by patterning the buffer material through a dry etching process using a photoresist film. Further, where the buffer material is of the same material as the passiviation film 270 of FIG. 2, the buffer pattern 31 can be directly patterned into the passivation film.

Figure 3B:
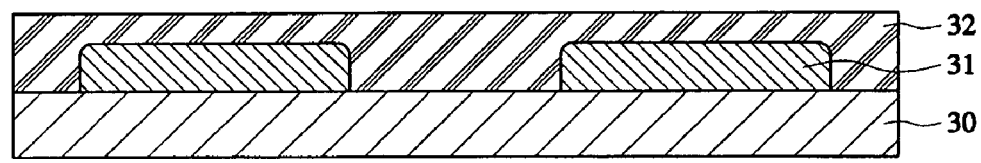

Referring to FIG. 3B, an anode electrode material 32 is deposited on a substrate 30 including the buffer pattern 31. According to an aspect of the invention, the anode electrode material 32 is formed to a thickness of 40 to 200 nm. However, it is understood that other thicknesses can be used.

Where the organic electroluminescent display device is a front emission type organic electroluminescent display device, the anode electrode material 32 is a reflective electrode material. Where the organic electroluminescent display device is a rear emission type organic electroluminescent display, the anode electrode material 32 is a transmittive electrode material. In a front emission type structure, the anode electrode 33 may use a single layer of the reflective electrode material, or the anode electrode 33 may use a multilayer in which a bi-layer or triple-layer transparent conductive material is formed on the reflective electrode material. However, it is understood that other materials and constructions can be used.

The reflective electrode material for the anode electrode includes, but is not limited to, Al, Al/ITO, Cr, Pt, Au, Ag, Ag/ITO, Al/IZO, Ag/IZO, Pd, Ni or alloy film thereof. According to an aspect of the invention, the transmittive electrode material for the anode electrode includes, but is not limited to, Indium Tin Oxide (ITO), Indium Zinc Oxide (IZO), or Antimony Tin Oxide (ATO).

Figure 3C:
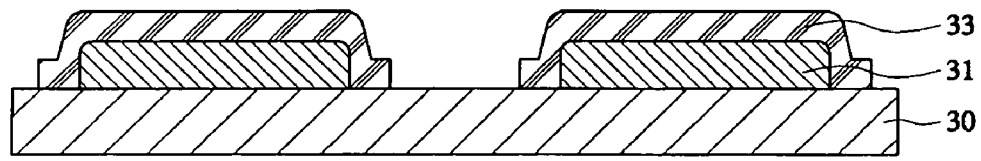

Referring to FIG. 3C, adjacent pairs of the anode electrodes 33 are separated from each other and are arranged per pixel. The anode electrodes 33 are formed by etching the anode electrode material 32. The anode electrode 33 is formed in such a way that the anode electrode 33 has a step difference that is as much as a thickness of the buffer pattern 31.

Figure 3D:
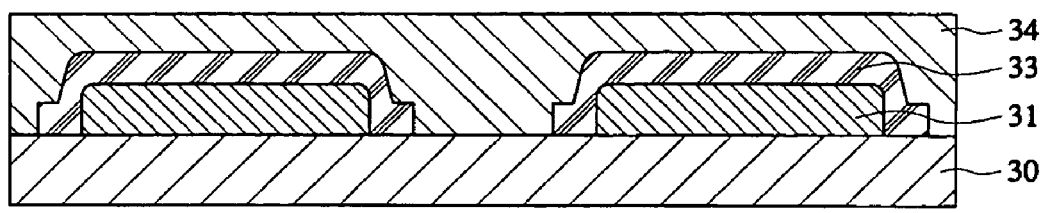

Referring to FIG. 3D, an organic insulation film 34, such as the thermosetting resin or the photosensitive resin, is formed on the substrate 301. A thickness of the organic insulation film 34 is at least the same as or lower than a sum of the thickness of the buffer pattern 31 and the anode electrodes 33. As shown, the thickness of the organic insulation film 34 is greater than the sum of the-thickness of the buffer pattern 31 and the anode electrodes 33.

Figure 3E:
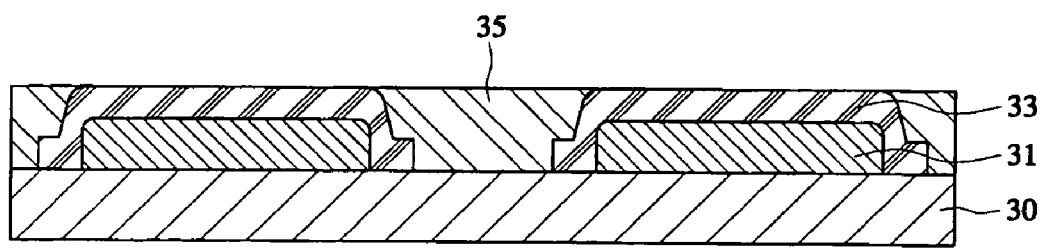

Referring to FIG. 3E, a pixel define layer 35 is formed on the substrate between the anode electrodes 33 by patterning the organic insulation film 34 in the same method as a method for forming the buffer pattern 31. The pixel define layer 35 has at least the same step difference as or a lower step difference than the anode electrode 33 by the buffer pattern 31 so that the pixel define layer 35 defines neighboring pixels. However, it is understood that, where the thickness of the organic insulation film 34 is less than or equal to the sum of the thickness of the buffer pattern 31 and the anode electrodes 33, a patterning operation need not be performed.

Subsequently, an organic electroluminescent display device of an embodiment of the present invention is formed by forming an organic thin film layer 310 on the anode electrode 33 using a laser induced thermal imaging method or an inkjet method and forming a cathode electrode 320 on the organic thin film layer 310 as illustrated in FIG. 2.

According to an embodiment of the present invention as described in the above, an organic emission layer having good film quality is formed by forming the anode electrode using the buffer pattern for smoothing a step difference so that the anode electrode has no step difference with the pixel define layer in an organic electroluminescent display device. Therefore, luminance uniformity of device is improved, and the lifetime of the device is extended.

While the invention has been particularly shown and described with reference to embodiments thereof, it will be understood by those skilled in the art that the foregoing and other changes in form and details may be made therein without departing from the spirit and scope of the invention and equivalents thereof.

What is claimed is:

1. An organic electroluminescent display device comprising:
   a substrate;
   a lower electrode formed on the substrate, the lower electrode having a substantilly planar upper surface at a first step difference above the substrate;
   a pixel define layer formed on the substrate and covering one portion of the lower electrode while exposing another portion of the lower electrode, the portion of the pixel define layer, which covers the one portion of the lower electrode, having a planar upper surface at a second step difference above the substrate;
   an organic thin film layer formed on the lower electrode; and
   an upper electrode formed on the organic thin film layer,
   wherein the second step difference of the pixel define layer is not greater than the first step difference of the lower electrode.

2. The organic electroluminescent display device according to claim 1, wherein the pixel define layer comprises a thermosetting resin or a photosensitive resin.

3. The organic electroluminescent display device according to claim 1, further comprising a buffer pattern between the lower electrode and the substrate and which has a predetermined thickness sufficient to reduce a difference between the first and second step differences.

4. The organic electroluminescent display device according to claim 3, wherein a thickness of the pixel define layer above the substrate is substantially the same as or less than a sum of thicknesses of the lower electrode and the buffer pattern above the substrate.

5. The organic electroluminescent display device according to claim 3, wherein the buffer pattern includes an inorganic insulation film comprising an oxide film or a nitride film.

6. The organic electroluminescent display device according to claim 3, wherein the buffer pattern comprises an organic insulation film comprising a thermosetting resin or a photosensitive resin.

7. The organic electroluminescent display device according to claim 1, wherein the lower electrode comprises a reflective electrode material, a transmittive electrode material, or a stacked layer of the reflective electrode material and the transmittive electrode material.

8. The organic electroluminescent display device according to claim 7, wherein the lower electrode comprises the reflective electrode material selected from the group consisting of Al, Al/ITO, Cr, Pt, Au, Ag, Ag/ITO, Al/IZO, Ag/IZO, Pd, Ni and an alloy film thereof.

9. The organic electroluminescent display device according to claim 7, wherein the lower electrode comprises the transmittive electrode material selected from the group consisting ITO, IZO and ATO.

10. The organic electroluminescent display device according to claim 1, wherein the second step difference of the pixel define layer is less than or substantially equal to the first step difference of the lower electrode.

11. An organic electroluminescent display device comprising:
   a substrate;
   a lower electrode formed on the substrate, the lower electrode having a substantially planar upper surface at a first step difference above the substrate;
   a pixel define layer formed on the substrate and covering one portion of the lower electrode while exposing another portion of the lower electrode, the pixel define layer having an upper surface at a second step difference above the substrate;

an organic thin film layer formed on the lower electrode;

an upper electrode formed on the organic thin film layer; and a buffer pattern between the lower electrode and the substrate and which has a predetermined thickness sufficient to reduce a difference between the first and second step differences, wherein the second step difference of the pixel define layer is less than or substantially equal to the first step difference of the lower electrode.

12. The organic electroluminescent display device according to claim 11, wherein a thickness of the pixel define layer above the substrate is substantially the same as or less than a sum of thicknesses of the lower electrode and the buffer pattern above the substrate.

13. The organic electroluminescent display device according to claim 11, wherein the buffer pattern includes an inorganic insulation film comprising an oxide film or a nitride film.

14. The organic electroluminescent display device according to claim 11, wherein the buffer pattern comprises an organic insulation film comprising a thermosetting resin or a photosensitive resin.

* * * * *

UNITED STATES PATENT AND TRADEMARK OFFICE
CERTIFICATE OF CORRECTION

PATENT NO. : 7,486,016 B2  Page 1 of 1
APPLICATION NO. : 10/820845
DATED : February 3, 2009
INVENTOR(S) : Kwan-Hee Lee et al.

It is certified that error appears in the above-identified patent and that said Letters Patent is hereby corrected as shown below:

Column 6, line 6, delete "substantially".

Signed and Sealed this

Twenty-ninth Day of September, 2009

David J. Kappos
*Director of the United States Patent and Trademark Office*

UNITED STATES PATENT AND TRADEMARK OFFICE
CERTIFICATE OF CORRECTION

PATENT NO. : 7,486,016 B2 Page 1 of 1
APPLICATION NO. : 10/820845
DATED : February 3, 2009
INVENTOR(S) : Kwan-Hee Lee et al.

It is certified that error appears in the above-identified patent and that said Letters Patent is hereby corrected as shown below:

Title Page, Item (73) Assignee, change "Samsung SDI Co., Ltd., Suwon-si (KR)" to --Samsung Mobile Display Co., Ltd., Suwon-si (KR)--.

Signed and Sealed this

Sixth Day of April, 2010

David J. Kappos
*Director of the United States Patent and Trademark Office*